(12) United States Patent
Sayyah et al.

(10) Patent No.: US 11,226,403 B2
(45) Date of Patent: Jan. 18, 2022

(54) CHIP-SCALE COHERENT LIDAR WITH INTEGRATED HIGH POWER LASER DIODE

(71) Applicant: GM Global Technology Operations LLC, Detroit, MI (US)

(72) Inventors: Keyvan Sayyah, Santa Monica, CA (US); Raymond Sarkissian, Studio City, CA (US); Oleg Efimov, Thousand Oaks, CA (US); Pamela R. Patterson, Los Angeles, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 944 days.

(21) Appl. No.: 15/957,974

(22) Filed: Apr. 20, 2018

(65) Prior Publication Data
US 2019/0018139 A1    Jan. 17, 2019

Related U.S. Application Data

(60) Provisional application No. 62/531,414, filed on Jul. 12, 2017.

(51) Int. Cl.
*G01S 7/481* (2006.01)
*G01S 7/4911* (2020.01)
(Continued)

(52) U.S. Cl.
CPC .............. *G01S 7/4815* (2013.01); *B81B 7/02* (2013.01); *G01S 7/4816* (2013.01);
(Continued)

(58) Field of Classification Search
CPC .... G01S 7/4815; G01S 7/4816; G01S 7/4817; G01S 7/4818; G01S 7/491; G01S 7/4911; G01S 7/4913; G01S 7/4914; G01S 7/4972; G01S 17/003; G01S 17/02; G01S 17/32; G01S 17/58; B81B 7/02; B81B 2207/03; G02B 6/122; G02B 27/30; H01L 23/544; H01L 32/02327; H01L 31/16;
(Continued)

(56) References Cited

U.S. PATENT DOCUMENTS 5,139,879 A    8/1992 Aharoni
5,283,846 A    2/1994 Toyonaka
(Continued)

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — Luke D Ratcliffe
(74) *Attorney, Agent, or Firm* — Cantor Colburn LLP

(57) ABSTRACT

A chip-scale coherent lidar system includes a master oscillator integrated on a chip to simultaneously provide a signal for transmission and a local oscillator (LO) signal. The system also includes a beam steering device to direct an output signal obtained from the signal for transmission out of the system, and a combiner on the chip to combine the LO signal and a return signal resulting from a reflection of the output signal by a target. One or more photodetectors obtain a result of interference between the LO signal and the return signal to determine information about the target.

19 Claims, 4 Drawing Sheets

(51) Int. Cl.
| | |
|---|---|
| *G01S 17/58* | (2006.01) |
| *G01S 17/34* | (2020.01) |
| *G01S 17/931* | (2020.01) |
| *G01S 17/02* | (2020.01) |
| *G02B 6/122* | (2006.01) |
| *G02B 6/42* | (2006.01) |
| *H01L 31/0232* | (2014.01) |
| *H01L 31/16* | (2006.01) |
| *G01S 17/00* | (2020.01) |
| *G01S 17/32* | (2020.01) |
| *G01S 7/491* | (2020.01) |
| *G01S 17/42* | (2006.01) |
| *G01S 17/86* | (2020.01) |
| *G01S 7/499* | (2006.01) |
| *G02B 6/27* | (2006.01) |
| *H01L 23/544* | (2006.01) |
| *G01S 7/4914* | (2020.01) |
| *G01S 7/497* | (2006.01) |
| *B81B 7/02* | (2006.01) |
| *G02B 27/30* | (2006.01) |
| *H01S 5/125* | (2006.01) |
| *G01S 7/4913* | (2020.01) |
| *G02B 6/00* | (2006.01) |

(52) U.S. Cl.
CPC .......... *G01S 7/4817* (2013.01); *G01S 7/4818* (2013.01); *G01S 7/491* (2013.01); *G01S 7/499* (2013.01); *G01S 7/4911* (2013.01); *G01S 7/4913* (2013.01); *G01S 7/4914* (2013.01); *G01S 7/4972* (2013.01); *G01S 17/003* (2013.01); *G01S 17/02* (2013.01); *G01S 17/32* (2013.01); *G01S 17/34* (2020.01); *G01S 17/42* (2013.01); *G01S 17/58* (2013.01); *G01S 17/86* (2020.01); *G01S 17/931* (2020.01); *G02B 6/122* (2013.01); *G02B 6/2766* (2013.01); *G02B 6/4209* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *G02B 2006/0098* (2013.01); *H01L 2223/54426* (2013.01); *H01L 2223/54486* (2013.01)

(58) Field of Classification Search
CPC . H01L 2223/54426; H01L 2223/54486; H01S 5/125
See application file for complete search history.

(56) References Cited

U.S. PATENT DOCUMENTS

| | | |
|---|---|---|
| 5,499,132 A | 3/1996 | Tojo |
| 6,122,110 A | 11/2000 | Park |
| 6,229,947 B1 | 5/2001 | Vawter |
| 6,480,331 B1 | 11/2002 | Cao |
| 6,962,345 B2 | 11/2005 | Inciong |
| 7,108,810 B2 | 9/2006 | Nakamura |
| 7,359,593 B2 | 4/2008 | Little |
| 7,481,588 B2 | 1/2009 | Monte |
| 8,116,602 B2 | 2/2012 | Little |
| 8,121,450 B2 | 2/2012 | Webster |
| 9,122,037 B2 | 9/2015 | Shastri |
| 9,310,471 B2 | 4/2016 | Sayyah |
| 9,335,480 B1 | 5/2016 | Celo |
| 9,575,162 B2 | 2/2017 | Owechko |
| 9,810,775 B1* | 11/2017 | Welford .................. H01S 3/113 |
| 2001/0030807 A1 | 10/2001 | Ikari |
| 2002/0012167 A1 | 1/2002 | Wills |
| 2004/0070827 A1 | 4/2004 | Li |
| 2005/0018967 A1 | 1/2005 | Huang |
| 2005/0213979 A1 | 9/2005 | Nakashima |
| 2006/0002443 A1 | 1/2006 | Farber |
| 2010/0200898 A1 | 8/2010 | Lin |
| 2011/0122895 A1* | 5/2011 | Savage-Leuchs ..... H01S 3/1022 372/10 |
| 2012/0152918 A1 | 6/2012 | Li |
| 2013/0209033 A1 | 8/2013 | Luff |
| 2015/0042992 A1 | 2/2015 | Cui |
| 2015/0378012 A1* | 12/2015 | Sayyah .................. G01S 17/34 356/4.01 |
| 2017/0153319 A1 | 6/2017 | Villeneuve |
| 2017/0184450 A1 | 6/2017 | Doylend |
| 2017/0299697 A1* | 10/2017 | Swanson ............ G01N 21/4795 |
| 2017/0336565 A1 | 11/2017 | Ryckman |
| 2017/0370676 A1 | 12/2017 | Volfson |
| 2018/0024299 A1 | 1/2018 | Leijtens |

OTHER PUBLICATIONS

Schroedter et al., "Microcontroller based closed-loop control of a 2D quasi-static/resonant microscanner with on-chip piezo-resistive sensor feedback", Proc. Of SPIE, vol. 10116, 2017, pp. 1-12.
Winter et al., "Micro-beamer based on MEMS micro-mirrors and laser light source", Procedia Chemistry, vol. 1, Issue 1, 2009, pp. 1311-1314.

* cited by examiner

CHIP-SCALE COHERENT LIDAR WITH INTEGRATED HIGH POWER LASER DIODE

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to chip-scale coherent lidar with an integrated high power laser diode.

Vehicles (e.g., automobiles, trucks, construction equipment, farm equipment, automated factory equipment) are increasingly outfitted with sensors that provide information to augment or automate vehicle operation. Exemplary sensors include radio detection and ranging (radar) systems, cameras, microphones, and light detection and ranging (lidar) systems. An exemplary lidar system is a coherent lidar system that transmits a frequency modulated continuous wave (FMCW) signal and relies on optical coherence between the transmitted signal and a return signal resulting from reflected scattering of the transmitted signal by a target to perform detection of the target. In applications, such as the vehicle application, reducing the size and cost of the lidar system may be beneficial. Accordingly, it is desirable to provide a chip-scale coherent lidar with an integrated high power laser diode.

SUMMARY

In one exemplary embodiment, a chip-scale coherent lidar system includes a master oscillator integrated on a chip to simultaneously provide a signal for transmission and a local oscillator (LO) signal. The system also includes a beam steering device to direct an output signal obtained from the signal for transmission out of the system, and a combiner on the chip to combine the LO signal and a return signal resulting from a reflection of the output signal by a target. One or more photodetectors obtain a result of interference between the LO signal and the return signal to determine information about the target.

In addition to one or more of the features described herein, the master oscillator includes a gain medium that is modulated by a current source to provide a frequency modulated continuous wave (FMCW) signal.

In addition to one or more of the features described herein, the current source is off the chip.

In addition to one or more of the features described herein, the master oscillator also includes a first mirror to output the signal for transmission and a second mirror to output the LO signal, and the system also includes an amplifier to amplify the signal for transmission to produce the output signal.

In addition to one or more of the features described herein, the first mirror is a low-reflectivity mirror and the second mirror is a high-reflectivity mirror.

In addition to one or more of the features described herein, a reflectivity of the first mirror is 5-10 percent, and the reflectivity of the second mirror is 80-90 percent.

In addition to one or more of the features described herein, the amplifier is a semiconductor optical amplifier on the chip with an off-chip current source.

In addition to one or more of the features described herein, the output signal has an output power on the order of 500 milliwatts (mW) and the LO signal has an output power on the order of 5 mW.

In addition to one or more of the features described herein, the master oscillator is a distributed Bragg reflector laser diode (DBR-LD).

In addition to one or more of the features described herein, the one or more photodetectors is a germanium-on-silicon (Ge-on-Si) photodetectors.

In addition to one or more of the features described herein, the system is a monostatic system and further comprises a circulator.

In addition to one or more of the features described herein, the system is bistatic.

In addition to one or more of the features described herein, the system is within or on a vehicle and detects a location and speed of an object relative to the vehicle.

In another exemplary embodiment, a method of assembling a coherent lidar system includes integrating a master oscillator and an optical amplifier on a chip to simultaneously provide an output signal and a local oscillator (LO) signal. The master oscillator includes a gain medium, a first mirror, and a second mirror. The method also includes arranging a first current source to supply the gain medium and a second current source to supply the optical amplifier.

In addition to one or more of the features described herein, the method also includes arranging the first mirror to pass through a transmit signal from the gain medium to the optical amplifier and arranging the second mirror to pass through the LO signal from the gain medium.

In addition to one or more of the features described herein, the method also includes configuring the first current source to modulate a frequency of the gain medium.

In yet another exemplary embodiment, a vehicle includes a chip-scale coherent lidar system. The system includes a master oscillator integrated on a chip to simultaneously provide a signal for transmission and a local oscillator (LO) signal. The system also includes a beam steering device to direct an output signal obtained from the signal for transmission out of the system, and a combiner on the chip to combine the LO signal and a return signal resulting from a reflection of the output signal by a target. One or more photodetectors obtain a result of interference between the LO signal and the return signal to determine information about the target. The vehicle also includes a controller to augment or automate operation of the vehicle based on information obtained from the return signal in the lidar system.

In addition to one or more of the features described herein, the master oscillator includes a gain medium that is modulated by a current source to provide a frequency modulated continuous wave (FMCW) signal.

In addition to one or more of the features described herein, the master oscillator also includes a first mirror to output the signal for transmission and a second mirror to output the LO signal, and the system also includes an amplifier to amplify the signal for transmission to produce the output signal.

In addition to one or more of the features described herein, the first mirror is a low-reflectivity mirror and the second mirror is a high-reflectivity mirror.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
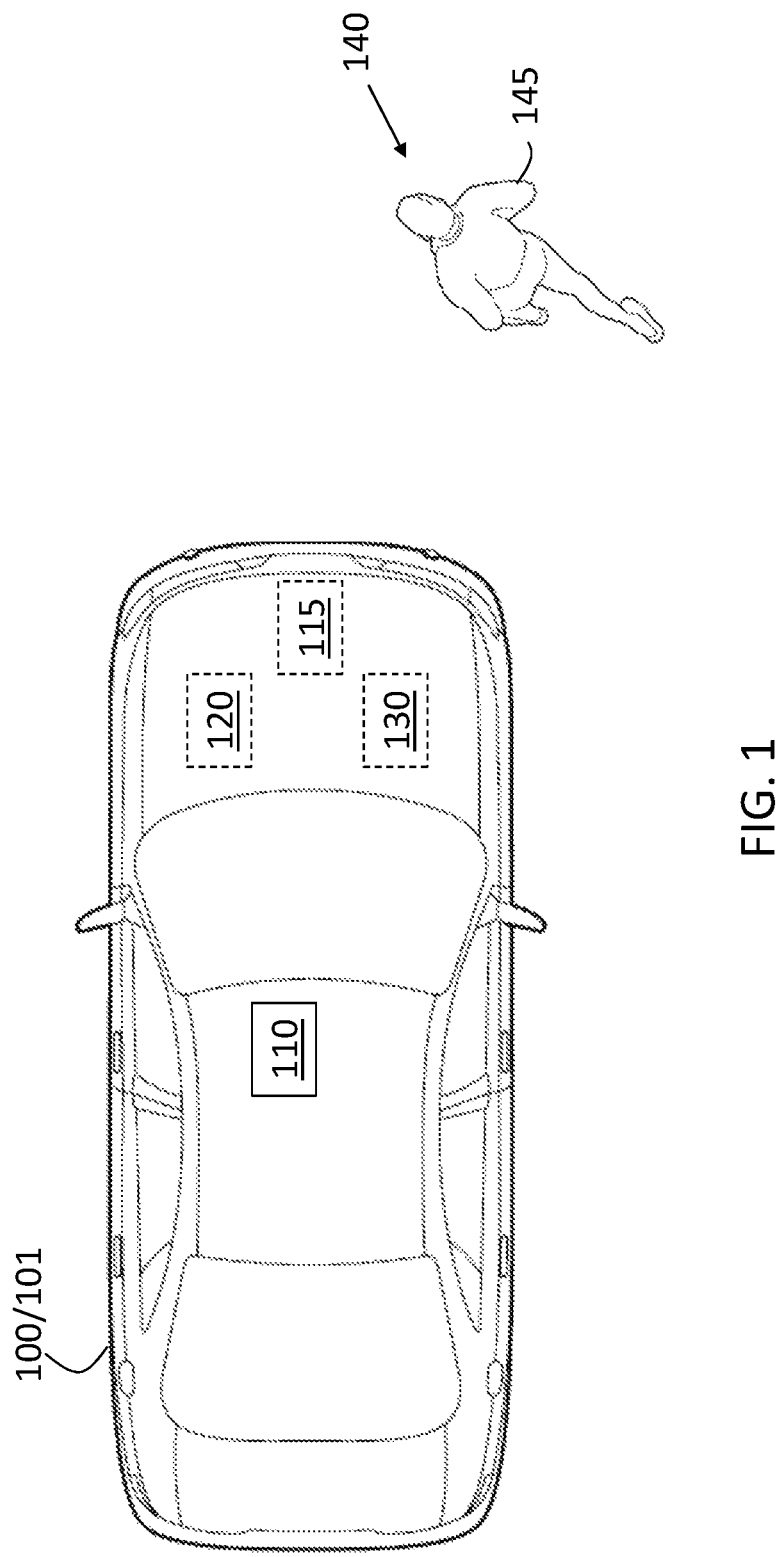
FIG. 1 is a block diagram of a scenario involving a chip-scale coherent lidar system with an integrated high power laser diode according to one or more embodiments.

The following description is merely exemplary in nature and is not intended to limit the present disclosure, its application or uses. It should be understood that throughout the drawings, corresponding reference numerals indicate like or corresponding parts and features.

As previously noted, a coherent lidar system may be one of the sensors used to augment or automate vehicle operation. In applications like object detection in a vehicle, compactness in the arrangement and packaging of the components is beneficial. A chip-scale lidar may be preferred to achieve this objective. Although not all components of the chip-scale coherent lidar are integrated, it is highly desirable to integrate the high power laser diode optical source with the lidar photonic chip. Embodiments of the systems and methods detailed herein relate to chip-scale coherent lidar with an integrated high power laser diode. The high power laser facilitates long range lidar applications (e.g., over 100 meters).

Figure 2:
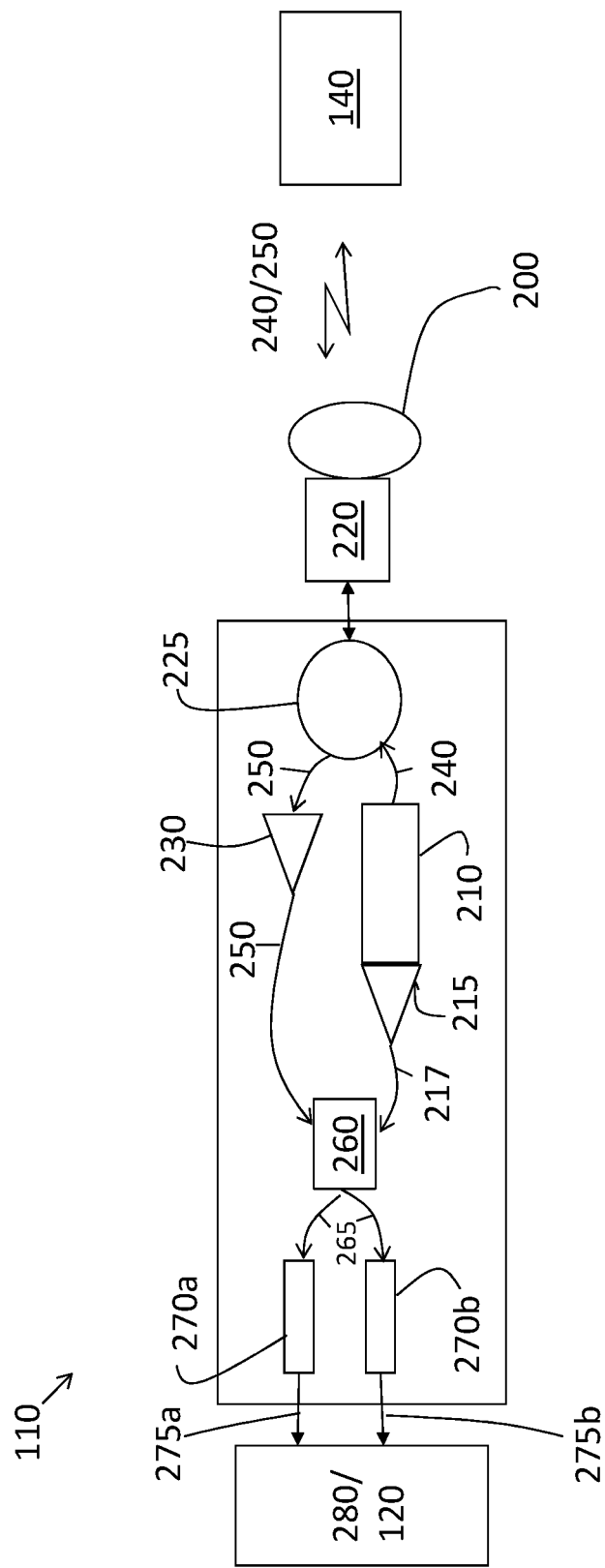
FIG. 2 is a block diagram of an on-chip coherent lidar system according to one or more embodiments.

In accordance with an exemplary embodiment, FIG. 1 is a block diagram of a scenario involving a chip-scale coherent lidar system 110 with an integrated high power laser diode. The vehicle 100 shown in FIG. 1 is an automobile 101. A coherent lidar system 110, further detailed with reference to FIG. 2, is shown on the roof of the automobile 101. According to alternate or additional embodiments, one or more lidar systems 110 may be located elsewhere on the vehicle 100. Another sensor 115 (e.g., camera, sonar, radar system) is shown, as well. Information obtained by the lidar system 110 and one or more other sensors 115 may be provided to a controller 120 (e.g., electronic control unit (ECU)) for image or data processing, target recognition, and subsequent vehicle control.

The controller 120 may use the information to control one or more vehicle systems 130. In an exemplary embodiment, the vehicle 100 may be an autonomous vehicle and the controller 120 may perform known vehicle operational control using information from the lidar system 110 and other sources. In alternate embodiments, the controller 120 may augment vehicle operation using information from the lidar system 110 and other sources as part of a known system (e.g., collision avoidance system, adaptive cruise control system). The lidar system 110 and one or more other sensors 115 may be used to detect objects 140, such as the pedestrian 145 shown in FIG. 1. The controller 120 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

FIG. 2 is a block diagram of an on-chip coherent lidar system 110 according to one or more embodiments. The exemplary lidar system 110 shown in FIG. 2 is a monostatic system that uses a circulator 225 to facilitate the use of the same aperture lens 200 for light output from the lidar system 110 as an output signal 240 and light obtained by the lidar system 110 as a receive beam 250. A beam steering device 220 may be implemented as a scanning mirror actuated by microelectromechanical systems (MEMS) (i.e., a MEMS scanning mirror) that is used to direct the output signal 240 out of the lidar system 110 and direct the receive beam 250 to the circulator 225. The lidar system 110 includes a light source 210, which is an integrated laser diode that is detailed with reference to FIG. 4. The light source 210 outputs the output signal 240 and also outputs a local oscillator (LO) signal 217 via a spot size converter (SSC) 215. The SSC 215 couples the LO signal 217 to a planar on-chip waveguide.

If a target 140 is in the field of view of the lidar system 110, as in the example shown in FIG. 2, the output signal 240 from the lidar system 110 is scattered by the target 140. Some of that scattered light reenters the lidar system 110 as a receive beam 250. The receive beam 250 enters the aperture lens 200 and is directed, by the beam steering device 220, to the circulator 225. A second SSC 230 couples the incoming receive beam 250 to a planar waveguide. The LO signal 217 and the receive beam 250 are both input to a combiner 260. The combined signal 265 is then split to two photodetectors 270a, 270b (generally referred to as 270). The photodetectors 270 may be dual-balanced germanium-on-silicon (Ge-on-Si) photodetectors, for example.

The LO signal 217 and receive beam 250 in the combined signal 265 interfere with each other and a resulting radio frequency (RF) beat signal is detected by each of the photodetectors 270. The interference between the receive beam 250 and the LO signal 217 results in a coherent combination of the two beams. Thus, the lidar system 110 is referred to as a coherent lidar system, unlike a time-of-flight system, for example, in which direct detection of the receive beam is obtained. The interference in each photodetector 270 results in the RF beat signal which facilitates identification of a time-delayed receive beam 250 that resulted from the output signal 240. This prevents errant light from another light source outside the lidar system 110 that is within the field of view of the lidar system 110 from being mistaken for a receive beam 250 that is reflected by a target 140.

The photodetectors 270 are semiconductor devices that convert the result of the interference between the receive beam 250 and the LO signal 217 into electrical currents 275a, 275b (generally referred to as 275). These electrical currents 275 are also referred to as beat signals. The two photodetectors 270 are used in accordance with a known balanced detector technique to cancel intensity noise in the LO signal 217 (which is caused by the light source 210 and, thus, is the same in the output signal 240) that is common to both photodetectors 270. The electrical currents 275 from each of the photodetectors 270 are combined and processed to obtain three-dimensional information like range to the target 140 and the relative speed of the target 140 to the lidar system 110 as a function of two-dimensional spatial coordinates. The processing may be performed within the lidar system 110 by a processor 280 or outside the lidar system 110 by the controller 120, for example. The processor 280 may include processing circuitry similar to that discussed for the controller 120.

Figure 3:
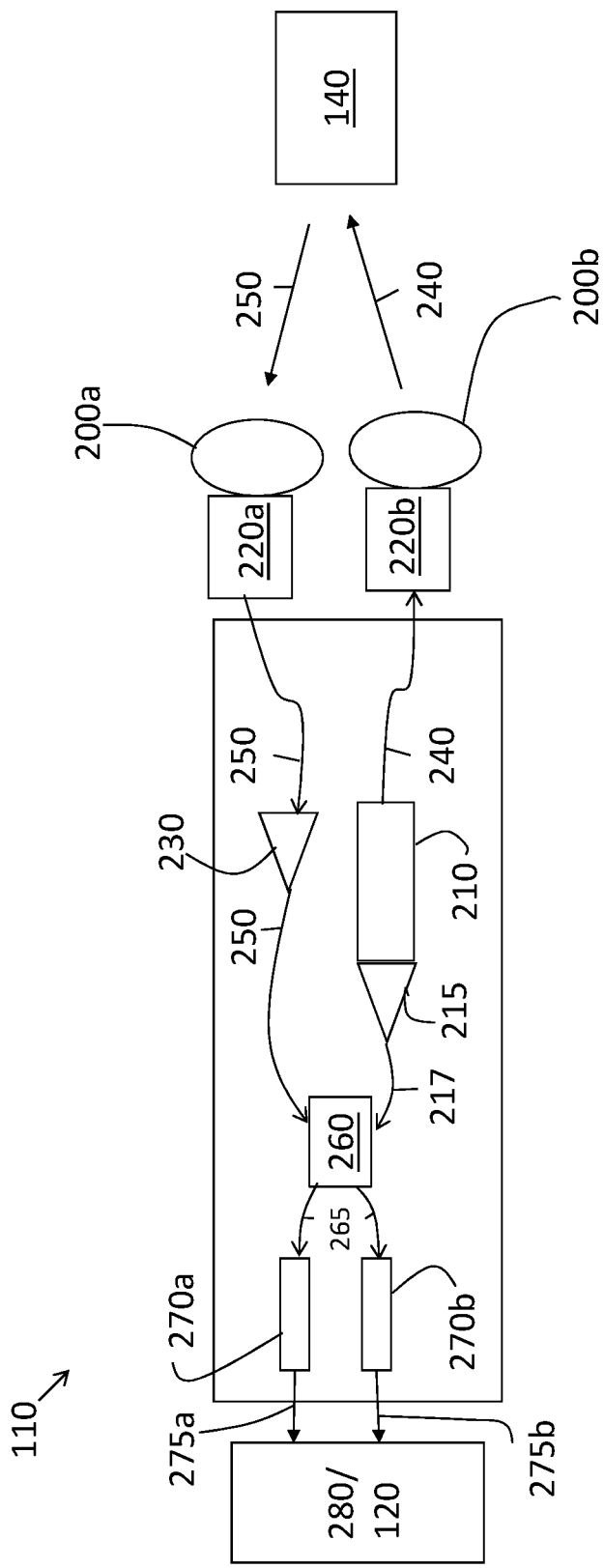
FIG. 3 is a block diagram of an on-chip coherent lidar system according to alternate one or more embodiments.

FIG. 3 is a block diagram of an on-chip coherent lidar system 110 according to alternate one or more embodiments. A bistatic lidar system 110 is shown in the exemplary embodiment of FIG. 3. Most of the bistatic lidar system 110, shown in FIG. 3, is similar to the monostatic lidar system 110, shown in FIG. 2. Thus, the components detailed with reference to FIG. 2 are not discussed again. As previously noted, the primary difference between the monostatic and bistatic systems is in the inclusion, in the bistatic system, of separate beam steering devices 220a, 220b (generally referred to as 220) and aperture lenses 200a, 200b (generally referred to as 200) for the output signal 240 and receive beam 250. As such, a circulator 250 is not needed in the bistatic system of FIG. 3.

Figure 4:
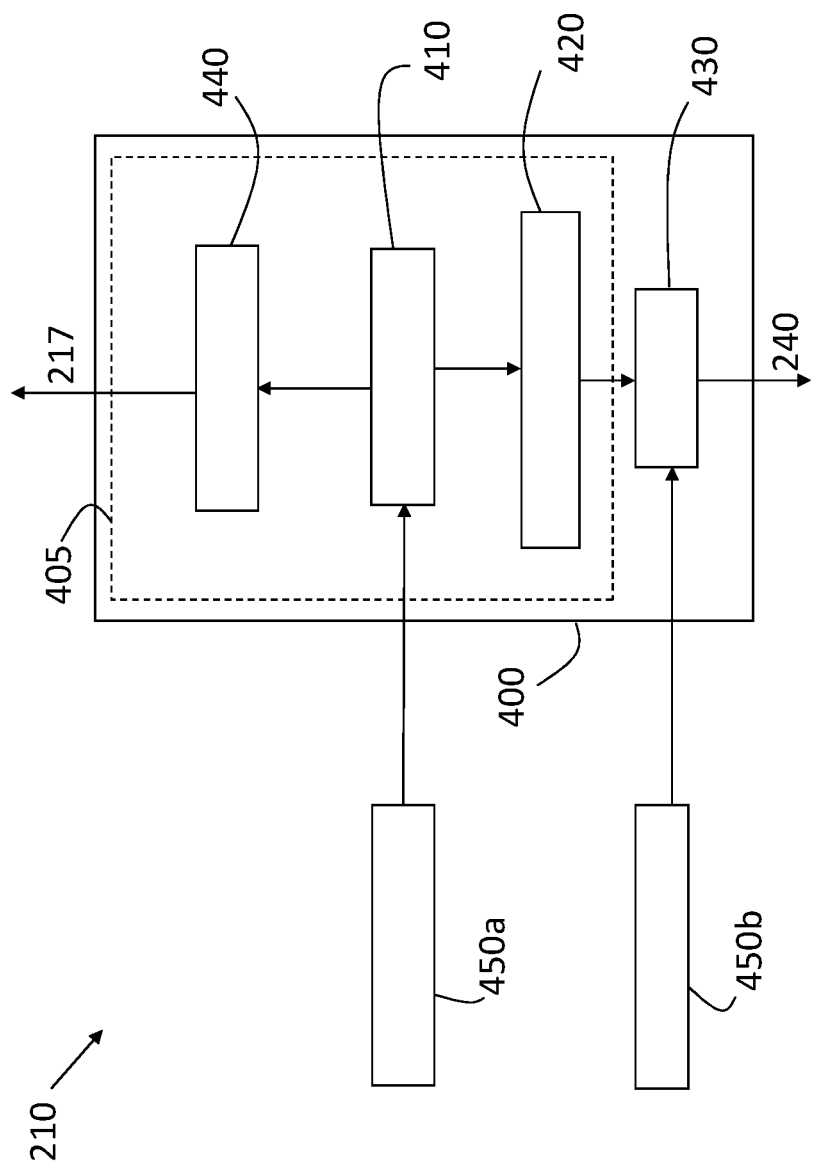
FIG. 4 details the light source of the lidar system according to one or more embodiments.

FIG. 4 details the light source 210 of the lidar system 110 according to one or more embodiments. As previously noted, the light source 210 is a chip-scale integrated high power laser diode. Specifically, the light source 210 is a high power narrow linewidth light source. As FIG. 4 indicates, the light source 210 includes components that are integrated on a chip 400 and current sources 450a, 450b (generally referred to as 450) that are not on the chip 400. In alternate embodiments, one or both of the current sources 450 may also be integrated on the chip. According to an exemplary embodiment, the light source 210 is in a master oscillator-power amplifier (MOPA) laser configuration. The master oscillator 405 may be a distributed Bragg Reflector (DBR) laser diode (LD) in the exemplary embodiment shown in FIG. 4. The master oscillator 405 includes a gain medium 410 (i.e., laser medium) powered by the current source 450a, and two DBR mirrors (output-side mirror 420 and LO-side mirror 440). The power amplifier 430 may be a semiconductor optical amplifier (SOA) powered by the current source 450b. In an exemplary embodiment, the modulation of the current source 450a results in the frequency modulation of the output signal 240 and the LO signal 217. Thus, controlling the current source 450a facilitates outputting an FMCW signal from the master oscillator 405.

According to an exemplary embodiment, the master oscillator 405 is a laser cavity including the gain medium 410 the output-side mirror 420 as a low-reflectivity mirror (e.g. reflectivity of 5-10 percent) and the LO-side mirror 440 as a high reflectivity mirror (e.g., reflectivity of 80-90 percent). The amplifier 430 (e.g., SOA) amplifies the output of the master oscillator 405 that passes through the output-side mirror 420 without compromising its linewidth. The resulting output signal 240 constitutes the transmit light before exiting the lidar system 110. The output of the master oscillator 405 that passes through the LO-side mirror 440 is the LO signal 217 that is used for coherent detection. Thus, the light source 210 provides both the output signal 240 and LO signal 217 simultaneously. The output signal 240 may have output power on the order of 500 milliwatt (mW) while the LO signal 217 has output power on the order of 5 mW. In alternate embodiments, the light source 210 may include a tapered DBR laser diode rather than a combination of a master oscillator 405 and the amplifier 430.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A chip-scale coherent lidar system, comprising:
    a master oscillator integrated on a chip and configured to simultaneously provide a signal for transmission and a local oscillator (LO) signal;
    a beam steering device configured to direct an output signal obtained from the signal for transmission out of the system;
    a combiner on the chip configured to combine the LO signal and a return signal resulting from a reflection of the output signal by a target; and
    one or more photodetectors configured to obtain a result of interference between the LO signal and the return signal to determine information about the target, wherein the system includes an amplifier to amplify the signal for transmission to produce the output signal and the output signal has an output power on the order of 500 milliwatts (mW) and the LO signal has an output power on the order of 5 mW.

2. The system according to claim 1, wherein the master oscillator includes a gain medium that is modulated by a current source to provide a frequency modulated continuous wave (FMCW) signal.

3. The system according to claim 2, wherein the current source is off the chip.

4. The system according to claim 2, wherein the master oscillator also includes a first mirror to output the signal for transmission and a second mirror to output the LO signal.

5. The system according to claim 4, wherein the first mirror is a low-reflectivity mirror and the second mirror is a high-reflectivity mirror.

6. The system according to claim 5, wherein a reflectivity of the first mirror is 5-10 percent, and the reflectivity of the second mirror is 80-90 percent.

7. The system according to claim 4, wherein the amplifier is a semiconductor optical amplifier on the chip with an off-chip current source.

8. The system according to claim 2, wherein the master oscillator is a distributed Bragg reflector laser diode (DBR-LD).

9. The system according to claim 1, wherein the one or more photodetectors is a germanium-on-silicon (Ge-on-Si) photodetectors.

10. The system according to claim 1, wherein the system is a monostatic system and further comprises a circulator.

11. The system according to claim 1, wherein the system is bistatic.

12. The system according to claim 1, wherein the system is within or on a vehicle and is configured to detect a location and speed of an object relative to the vehicle.

13. A method of assembling a coherent lidar system, the method comprising:
    integrating a master oscillator and an optical amplifier on a chip to simultaneously provide an output signal and a local oscillator (LO) signal, wherein the master oscillator includes a gain medium, a first mirror, and a second mirror, wherein the optical amplifier produces the output signal with an output power on the order of 500 milliwatts (mW) and the LO signal with an output power on the order of 5 mW; and
    arranging a first current source to supply the gain medium and a second current source to supply the optical amplifier.

14. The method according to claim 13, further comprising arranging the first mirror to pass through a transmit signal from the gain medium to the optical amplifier and arranging the second mirror to pass through the LO signal from the gain medium.

15. The method according to claim 13, further comprising configuring the first current source to modulate a frequency of the gain medium.

16. A vehicle, comprising:
chip-scale coherent lidar system, comprising:
a master oscillator integrated on a chip and configured to simultaneously provide a signal for transmission and a local oscillator (LO) signal;
a beam steering device configured to direct an output signal obtained from the signal for transmission out of the system, wherein the chip-scale coherent lidar system includes an amplifier to amplify the signal for transmission to produce the output signal and the output signal has an output power on the order of 500 milliwatts (mW) and the LO signal has an output power on the order of 5 mW;
a combiner on the chip configured to combine the LO signal and a return signal resulting from a reflection of the output signal by a target; and
one or more photodetectors configured to obtain a result of interference between the LO signal and the return signal to determine information about the target; and
a controller configured to augment or automate operation of the vehicle based on information obtained from the return signal in the lidar system.

17. The vehicle according to claim 16, wherein the master oscillator includes a gain medium that is modulated by a current source to provide a frequency modulated continuous wave (FMCW) signal.

18. The vehicle according to claim 17, wherein the master oscillator also includes a first mirror to output the signal for transmission and a second mirror to output the LO signal, and the system also includes an amplifier to amplify the signal for transmission to produce the output signal.

19. The vehicle according to claim 18, wherein the first mirror is a low-reflectivity mirror and the second mirror is a high-reflectivity mirror.

* * * * *